| United States Patent [19] | [11] Patent Number: 4,552,691 |
| Shoji et al. | [45] Date of Patent: Nov. 12, 1985 |

[54] ELECTRICALLY CONDUCTIVE PASTES

[75] Inventors: Takashi Shoji; Kenji Ochiai, both of Saitama, Japan

[73] Assignee: Showa Denko Kabushiki Kaisha, Tokyo, Japan

[21] Appl. No.: 638,936

[22] Filed: Aug. 9, 1984

[51] Int. Cl.$^4$ ............................................... H01B 1/06
[52] U.S. Cl. .................... 252/514; 252/512; 106/1.18; 106/1.19; 106/1.21
[58] Field of Search ................ 252/514, 512, 364; 106/1.05, 1.18, 1.19, 1.21, 311

[56] References Cited

U.S. PATENT DOCUMENTS

| 3,799,891 | 3/1974 | Smith | 252/514 |
| 3,846,345 | 11/1974 | Mason et al. | 252/518 |
| 3,918,980 | 11/1975 | Smith et al. | 252/514 |
| 3,929,491 | 12/1975 | Smith et al. | 252/514 |
| 4,400,214 | 8/1983 | Ogawa et al. | 252/514 |
| 4,414,143 | 11/1983 | Felten | 252/514 |
| 4,466,830 | 8/1984 | Rellick | 252/514 |

*Primary Examiner*—Josephine L. Barr
*Attorney, Agent, or Firm*—Sughrue, Mion, Zinn, Macpeak and Seas

[57] ABSTRACT

An electrically conductive paste is disclosed, which comprises (i) 60 to 90 wt % of metal fine powders comprising a silver fine powder, a composite fine powder of silver and copper and optionally either, a composite fine powder of silver and platinum or a platinum fine powder, or a composite fine powder of silver and palladium or a palladium fine powder, the copper content in the metal fine powders is 0.1 to 10 wt %, the platinum content, if present, is 0.2–10 wt % and the palladium content, if present, is 0.2–30 wt %, and (ii) 10 to 40 wt % of a vehicle component, such as terpineol, butylcarbitol, ethyl cellulose etc. The product can resist thermal shocks and has strong bonding strength having remarkably improved heat deterioration characteristics.

13 Claims, No Drawings

ELECTRICALLY CONDUCTIVE PASTES

FIELD OF THE INVENTION

This invention relates to pastes for cerdip substrate in particular, dotting pastes.

BACKGROUND OF THE INVENTION

In the recent years, electronic instruments have been remarkably made thinner and more compact, and their reliability has been greatly enhanced with the increase in the density of integration and their application has steadily expanded. A monolithic IC has undergone a rapid increase in the density and compactification, while also in the hybrid IC field, especially in industrial instruments such as control circuits for automobiles, power module devices etc., there has been made an effort toward large-sized hybrid IC having excellent heat resistance and thermal shock resistance. In the latest hybrid IC a ceramic substrate carries active components such as diodes, transistors, semiconductor IC etc. and also almost all electrical parts such as coils, transformers, condensers etc. Hybrid integrated circuits having a further increased degree of integration and greatly enhanced reliability have been developed.

The hybrid IC is constructed by packaging individual parts or IC elements on a ceramic substrate on by applying thick film-forming techniques. A cerdip IC is generally made by fixing silicon IC chips on an alumina substrate comprising 91–96% $Al_2O_3$ using a bonding paste, but it still needs even higher strength bond imparting better durability.

In general, for the bonding method for cerdip, Au based pastes, solder, glass etc. have been used, as described in, for example, U.S. Pat. No. 3,846,345. The Au based pastes have excellent electrical conductivity, are chemically stable, have the best bondability with Au wires, can easily be alloyed with Si, and are extremely good in bonding with substrate as described in U.S. Pat. No. 3,799,891. However, they have a disadvantage of being expensive. In order to eliminate this disadvantage, Ag—Pd based pastes have been developed which contains Ag instead of Au and also contained Pd so as to prevent the migration of Ag, as described in U.S. Pat. Nos. 3,929,491 and 3,918,980.

These conventional pastes are those obtained by mixing metal powders with vitreous metal oxides and kneading using vehicles, and in bonding with alumina substrate they rely solely on the bonding force due to sintering of the glass frit.

However, the glass frit is poor in thermal shock resistance and has a disadvantage that the bond strength is thermally deteriorated in a step of sintering substrate and packaging or by the change in surrounding temperature on use. Although attempts have been made to chemically combine it with alumina substrate by adding very small amounts of Cu etc. in order to enhance the bonding strength with the alumina substrate (See U.S. Pat. Nos. 3,929,491 and 3,918,980), it is difficult to greatly improve the heat deterioration characteristics as long as the glass frit is used. In other words, the mere addition of Cu fine powder causes separation of the Cu from other metal fine powders in the vehicle due to the difference in specific gravity, resulting in poor distribution on dotting, and therefore not only failing to give a uniform paste film but also giving a film having inadequate bonding strength because of poor diffusion on the alumina substrate. Further, the part where Cu is segregated during the course of firing undergoes localized oxidation and gets colored, and therefore a film having a uniform smooth surface cannot be obtained.

SUMMARY OF THE INVENTION

An object of this invention is to provide dotting pastes for cerdip IC, in particular, convenient, economical fritless type dotting pastes having improved bonding strength between alumina substrate and silicone chips and excellent heat resistance and thermal shock resistance.

Accordingly, this invention is an electrically conductive paste comprising (i) 60 to 90 wt % of metal fine powders which comprises a silver fine powder and a composite fine powder of silver and copper, wherein the copper content in the metal fine powders is 0.1 to 10 wt %, and (ii) 10 to 40 wt % of a vehicle component.

Another embodiment of this invention is an electrically conductive paste comprising (i) 60 to 90 wt % of metal fine powders which comprises a silver fine powder, a composite fine powder of silver and copper, and a composite fine powder of silver and platinum or a platinum fine powder, wherein the copper content in the metal fine powders is 0.1 to 10 wt % and the platinum content in the metal fine powders is 0.2 to 10 wt %, and (ii) 10 to 40 wt % of a vehicle component. This exerts effects to prevent the migration of Ag and to improve wire bondability and solderability.

Yet another embodiment of this invention is an electrically conductive paste comprising (i) 60 to 90 wt % of metal fine powders which comprises a silver fine powder, a composite fine powder of silver and copper, and a composite fine powder of silver and palladium or a palladium fine powder, wherein the copper content in the metal fine powders is 0.1 to 10 wt % and the palladium content in the metal fine powders is 0.2 to 30 wt %, and (ii) 10 to 40 wt % of a vehicle component. This is particularly excellent in prevention of the migration of Ag and has an effect to improve wire bondability and solderability.

DETAILED DESCRIPTION OF THE INVENTION

The silver fine powder which can be used in this invention generally has a particle size of 10 μm or less, preferably an average particle size ($D_{50}$) of 0.5 to 5 μm. If it exceeds 10 μm, the distribution in the vehicle is poor, and thus there is a risk of clogging of needle on dotting, and a smooth surface is not easily obtained on sintering. The silver fine powder can be obtained by the conventional reducing process or electrolytic process.

In this invention, any composite powder of silver and copper may be used as long as the silver particles and the copper particles are combined with each other in the vehicle, and plated powders, coprecipitated powders, mechanical alloy powders etc. may be used. With respect to mechanical alloy, J. S. Benjamin has described on *Metallurgical Transaction No.* 1, 1970, p. 2943. The composite powder can be easily obtained by a conventional manner. For example, the mechanical alloy powders are obtained by mixing and pulverizing silver and copper powders in a ball mill by high-speed, rotation, and they have the silver particles and the copper particles mechanically entangled and combined with each other and thus can maintain strong bonding between the silver particles and the copper particles without using any binder. The mechanical alloy powder is advantageously used in that a composite powder having a wide range of Cu content may freely be used. The composite powder generally has a particle size of 10 μm or less, preferably an average particle size ($D_{50}$) of 0.5 to 5 μm. The copper content in the composite powder of silver and copper is preferably 20 to 95 wt %. If the copper content is less than 20%, the film adhesion to substrate is not sufficient, whereas if it exceeds 95%, the effect of the composite powder is lost. Further, in order to facilitate dispersibility in the vehicle, the specific gravity value is preferably in the vicinity of the intermediate value between those of silver and copper.

The copper content in the metal powders in the electrically conductive paste is 0.1 to 10 wt %, preferably 2 to 5 wt %. If the copper content is less than 0.1 wt %, the diffusion thereof on the alumina is inadequate and hence the bonding strength is not increased. On the contrary, if the copper content exceeds 10 wt %, the oxidation of copper is remarkable, exerting an adverse influence.

The metal powder content in the electrically conductive paste should be 60 to 90 wt % and preferably 75 to 82 wt %, otherwise paste viscosity increases so that easy handling cannot be obtained.

The vehicle has functions to uniformly disperse the metal fine powders, to have appropriate viscosity and surface tension on use and to smoothly diffuse on the substrate surface. The vehicle used in this invention may be selected from conventional organic solvents such as terpineol, butylcarbitol, ethyl cellulose, butylcarbitol acetate, Texanol (trade name for 2,2,4-trimethylpentanediol-1,3-monoisobutyrate, produced by Eastman) etc. Further, 0.5 to 1.0 wt % of a surfactant may be added in order to improve compatibility with the metal powders and improve dispersibility. In the paste state, the viscosity is maintained high (generally 200 to 350 Kcps) in order to avoid the separation and segregation of the metal fine powder particles, but on use, the viscosity is adjusted to 40 to 450 cps by diluting with a solvent.

In the first embodiment of this invention, the gist of the invention resides in an electrically conductive paste which contains 60 to 90 wt % of metal fine powders comprising a silver fine powder and a composite fine powder of silver and copper, the copper content in the metal fine powders being 0.1 to 10 wt %, and the balance being a vehicle component. By composing the paste as described above, the obtained paste has thermal shock resistance and high strength bond having remarkably improved heat deterioration characteristics. Further, the paste according to this invention enjoys better dispersibility on dotting and provides an excellent surface film having smooth and uniform baking finish characteristics.

In the second embodiment of this invention, the paste of the first embodiment further contains platinum, that is, an electrically conductive paste which contains 60 to 90 wt % of metal fine powders comprising a silver fine powder, a composite fine powder of silver and copper, and a composite fine powder of silver and platinum or a platinum fine powder, the copper content in the metal fine powders being 0.1 to 10 wt % and the platinum content being 0.2 to 10 wt %, and the balance being a behicle component. By composing the paste as described above, the paste not only has thermal shock resistance and high strength bond having remarkably improved heat deterioration characteristics but also has effects to prevent migration and to improve wire bondability, fine line resolution, solderability and electrical conductivity. Further, where a wire is to be connected to a cavity part, this paste has a great advantage that Al wires can be used.

While platinum is chemically stable and hence is effective in improving the above-described characteristics even when it is singly incorporated, it is even more effective to use it as a composite powder with silver because they are uniformly dispersed in the vehicle. As the composite powder of silver and platinum, plated powders, coprecipitated powders, mechanical alloy powder etc. may be used. The platinum content in the composite powder is preferably 5 to 60 wt %. With the mechanical alloy powder, those having a high platinum content may easily be obtained. The composite powder generally has a particle size of 10 μm or less, preferably an average particle size ($D_{50}$) of about 5 μm or less.

The platinum content is 0.2 to 10 wt %, preferably 0.5 to 3.0 wt %, based on the metal particles in the paste. If the platinum content is less than 0.2%, the effect by the addition cannot be obtained, whereas if it exceeds 10%, the effect to cut the cost does not manifest.

In the third embodiment of this invention, the paste of the first embodiment further contains palladium, that is, an electrically conductive paste which contains 60 to 90 wt % of metal fine powders comprising a silver fine powder, a composite fine powder of silver and copper, and a composite fine powder of silver and palladium or a palladium fine powder, the copper content in the metal fine powders being 0.1 to 10 wt % and the palladium content being 0.2 to 30 wt %, and the balance being a vehicle component. By composing the paste as described above, the obtained paste not only has thermal shock resistance and improved heat deterioration characteristics but also especially exerts a remarkable effect to prevent the migration of silver and also has effects to improve wire bondability and solderability and to obtain a uniform film having a smooth surface.

Although it is well known that a paste incorporating palladium has an effect to prevent the migration of silver, the paste incorporating palladium singly has a disadvantage that palladium easily undergoes oxidation in the firing step and makes the surface roughness extremely coarse. For that reason, where palladium is to be added singly, it is necessary to use a fine powder having a particle size (maximum) of 5 μm or less and preferably having an average particle size ($D_{50}$) of 2 μm or less, more preferably 0.5 μm or less. As one of the aspects of this invention, by using a powder obtained by compounding palladium and silver, it has been discovered that a film having extremely good surface conditions can be obtained while preventing the oxidation of palladium.

As the composite powder of silver and palladium, coprecipitated powders, mechanical alloy powders, plated powders etc. may be used. The palladium content in the composite powder is suitably 10 to 40 wt %, preferably 20 to 30 wt %, more preferably 25 to 30 wt %. The composite powder generally has a particle size of 10 μm or less, preferably an average particle size ($D_{50}$) of about 5 μm or less.

The palladium content is 0.2 to 30 wt %, preferably 0.5 to 10 wt %, more preferably 1 to 2 wt %, based on the metal particles in the paste. If the palladium content is less than 0.2%, the effect of palladium cannot manifest, whereas even if more than 30% is added, a marked improvement in the characteristics cannot be expected.

The electrically conductive pastes of this invention can be dotted and fired on a base in a conventional manner. The firing condition is generally a 50~60 minute profile with a peak temperature of 910° to 930° C. for 8 to 10 minutes.

This invention is more particularly described by the following examples, but the invention should not be construed as being limited thereto.

EXAMPLE 1

Pastes were prepared by kneading on a three roll mill using the metal powders set forth in Table 1, and as a vehicle, terpineol, butylcarbitol and ethyl cellulose, and a surfactant. The silver powder used was a commercial reducing powder having a purity of 99.9% and a particle size of 1-4 μm. The composite powder of silver and copper used was a mechanical alloy powder obtained by high-speed mixing and pulverization of 50% of a silver powder and 50% of a copper powder in a ball mill, or an electroless plated powder containing 20% copper. The composite powder was classified to obtain those having a particle size of 10 μm or less.

The vehicle component used was that obtained by mixing terpineol and butylcarbitol at a ratio of 1:1, and adding thereto ethyl cellulose and a non-ionic surfactant in amounts of 12 wt % and 2.5 wt %, respectively, based on the weight of the above mixture. The viscosity at that time was measured on a Brookfield viscometer using a No. 14 spindle, to obtain 200±50 Kcps.

These metal powders and the vehicle were sufficiently kneaded using a three roll mill under the mixing condition set forth in Table 1 to obtain pastes.

Thereafter, each paste was diluted with a 1:1 solution of butylcarbitol and terpineol used as a thinner to adjust the final viscosity to about 100 cps, and used for dotting.

The substrate used were of black alumina (92% Al$_2$O$_3$; size: 31.7×13×2 mm), and the cavity size was 6.25×6.25×0.18 mm. The alumina substrate were used after washing with trichloren. On each cavity was fixed the viscosity-adjusted, diluted paste by dotting.

The dotting device used was one manufactured by Iwashita Engineering Co., Japan. Each electrically conductive paste thus obtained was dotted on the substrate dried at 120° C. for 20 minutes, and further fired in air in a thick film firing furnace, Model 4 MC manufactured by Watkins Johnson Co. The firing conditions were a 60-minute profile with a peak temperature of 910° C. for 10 minutes.

Each paste film surface thus obtained was observed and its surface roughness was measured by a surface roughness meter manufactured by Tokyo Seimitsu Co., Japan. Fifty samples were prepared using each paste for evaluation of the surface roughness.

Further, using Au preforms of 2.5×2.5 mm□×25 μm, silicon chips were bonded to the thick films obtained above at 450° C. by a die attaching device manufactured by Westbond Co. The cerdip IC thus obtained were subjected to a bonding strength test and a heat resistance test. The results of these tests are given in Table 1.

The bond strength was judged by die attach properties and a die push test. The die attach properties were determined by the time for scribing on bonding. In the die push test, a test piece after the heat resistance test was measured using a vertical bond tester manufactured by Engineered Technical Product Co. In Table 1, A means that none of the twenty test pieces showed film peal-off but die breakdown, B means that at least one of the twenty samples showed film peel-off, and C means that all of the twenty test pieces showed film peel-off.

As the heat resistance test, a heat cycle test and a thermal shock test were conducted. The test conditions were according to MILL-STD 883B 1010.2, CONDITION C for the heat cycle test, and MILL-STD 883 B 1011.2, CONDITION C for the thermal shock test.

For comparison, using electrically conductive pastes obtained by merely mixing a copper powder with or without glass frit, tests similar to the above were conducted and the obtained results are also given in Table 1.

TABLE 1

| | Starting Material Formulation (wt %) | | | | | Film | Film Characteristics | | | | |
|---|---|---|---|---|---|---|---|---|---|---|---|
| | Metal Powder (Calculated as Pure Form) | | | | | Thickness | Surface | Surface | Die | Die Push Test | |
| Sample No. | Silver | Copper | Powder Form | Frit | Vehicle | After firing (μm) | Conditions After firing | Roughness Rmax (μm) | Attach Properties | After Heat Cycle Test | After Thermal Shock Test |
| 1 | 74.92 | 0.08 | Mechanical Alloy | — | 25 | 13 | Good | 7 | Good | A | A |
| 2 | 74.62 | 0.38 | Mechanical Alloy | — | 25 | 14 | Good | 6 | Good | A | A |
| 3 | 72.75 | 2.25 | Mechanical Alloy | — | 25 | 14 | Good | 7 | Good | A | A |
| 4 | 69.00 | 6.00 | Mechanical Alloy | — | 25 | 13 | Good | 6 | Good | A | A |
| 5* | 75.00 | — | — | — | 25 | 14 | Good | 6 | Poor | C | C |
| 6* | 74.25 | 0.75 | Copper Single Element Powder | — | 25 | 12 | Black Stripe Pattern Appeared on Surface | 8 | Fair | B | C |
| 7* | 71.25 | 3.75 | Copper Single Element Powder | — | 25 | 16 | Black Stripe Pattern Appeared on Surface | 9 | Fair | B | B |
| 8* | 74.96 | 0.04 | Electroless Plated Powder | — | 25 | 14 | Good | 7 | Fair | B | B |
| 9* | 66.0 | 9.00 | Mechanical Alloy | — | 25 | 15 | Good | 8 | Poor | C | C |
| 10* | 73.63 | 0.37 | Copper Single Element Powder | 1 (PbO—based) | 25 | 14 | Glass Migrated onto Surface | 10 | Fair | C | C |

TABLE 1-continued

| Sample No. | Starting Material Formulation (wt %) | | | | | Film Thickness After firing (μm) | Film Characteristics | | | | |
|---|---|---|---|---|---|---|---|---|---|---|---|
| | Metal Powder (Calculated as Pure Form) | | | | | | Surface Conditions After firing | Surface Roughness Rmax (μm) | Die Attach Properties | Die Push Test | |
| | Silver | Copper | Powder Form | Frit | Vehicle | | | | | After Heat Cycle Test | After Thermal Shock Test |
| | | | | frit) | | | | | | | |

Note: *Comparative Sample

As clear from the results of Table 1, the electrically conductive pastes obtained using the composite powder of silver and copper according to this invention showed extremely excellent effects, i.e., the surface after firing was extremely smooth, the bonding strength between the silicon chips and the alumina substrate was strong, and further, the bonding strength did not deteriorate even when subjected to the heat history.

EXAMPLE 2

Platinum-added electrically conductive pastes were prepared using a silver fine powder, a composite fine powder of silver and copper according to the mechanical alloy process and a vehicle similar to those used in Example 1 by procedures similar to those in Example 1, and a bonding test was conducted. The platinum used was either a commercial fine powder of 0.5 to 0.8 μm, or a coprecipitated powder of silver and platinum at a ratio of 85:15, which was used after classification to 5 μm or less. The mixing conditions of the metal fine powders were as set forth in Table 2. The test conditions for the electrically conductive pastes were exactly the same as those in Example 1. The results of these tests are also given in Table 2.

high temperature atmosphere was measured. This measurement was conducted by comparing the resistance after leaving in air at 300° C. for 9 hours with the resistance before exposure. As a result, the resistance before exposure to high temperature atmosphere was 205 mΩ, and it became 210 mΩ after exposure to high temperature atmosphere. This resistance change was extremely small as compared with the case where the conventional product showed a change from 240 mΩ to 1050 mΩ, thus showing that the product of this invention is extremely thermally stable.

Furthermore, since the product of this invention has a very low resistance and good bondability this invention also has a great advantage that the use of aluminum wires is possible.

EXAMPLE 3

Palladium-added electrically conductive pastes were prepared using a silver fine powder, a composite fine powder of silver and copper according to the mechanical alloy process and a vehicle similar to those in Example 1 by procedures similar to those in Example 1, and a bonding test was conducted. The palladium used was either a commercial fine powder of a particle size of 0.8

TABLE 2

| Sample No. | Starting Material Formulation (wt %) | | | | | | | Film Thickness After firing (μm) | Film Characteristics | | | | |
|---|---|---|---|---|---|---|---|---|---|---|---|---|---|
| | Metal Powder (Calculated as Pure Form) | | | | | | | | Surface Conditions After firing | Surface Roughness Rmax (μm) | Die Attach Properties | Die Push Test | |
| | Silver | Copper | Powder Form | Platinum | Powder Form | Frit | Vehicle | | | | | After Heat Cycle Test | After Thermal Shock Test |
| 11 | 73.87 | 0.38 | Mechanical Alloy | 0.75 | Platinum Single Element Powder | — | 25 | 15 | Good | 9 | Good | A | A |
| 12 | 73.87 | 0.38 | Mechanical Alloy | 0.75 | Silver-Platinum Coprecipitated Powder | — | 25 | 15 | Good | 7 | Good | A | A |

As clear from Table 2, it has been found that the electrically conductive pastes using the platinum powder or the silver-platinum composite powder were good in the baking finish conditions of the film and the bonding strength was not deteriorated by the heat history.

Further, a bonding test of a wire to the cavity part was conducted using an alumina wire of 30 μm in diameter ness, and the change in resistance after exposure to to 1.8 μm or a coprecipitated powder of silver and palladium at a ratio by weight of 7:3, which was used after classification to 5 μm or less. The mixing conditions of the metal fine powders were as set forth in Table 3. The test conditions for the electrically conductive pastes were exactly the same as those in Example 1. The results of these tests are also given in Table 3.

TABLE 3

| Sample No. | Starting Material Formulation (wt %) | | | | | | | Film Thickness After firing (μm) | Film Characteristics | | | | |
|---|---|---|---|---|---|---|---|---|---|---|---|---|---|
| | Metal Powder (Calculated as Pure Form) | | | | | | | | Surface Conditions After firing | Surface Roughness Rmax (μm) | Die Attach Properties | Die Push Test | |
| | Silver | Copper | Powder Form | Platinum | Powder Form | Frit | Vehicle | | | | | After Heat Cycle Test | After Thermal Shock Test |
| 13 | 73.87 | 0.38 | Mechanical Alloy | 0.75 | Silver-Palladium Coprecipitated Powder | — | 25 | 15 | Good | 6 | Good | A | A |

TABLE 3-continued

| | Starting Material Formulation (wt %) | | | | | | Film Thickness After firing (μm) | Film Characteristics | | | Die Push Test | |
| | Metal Powder (Calculated as Pure Form) | | | | | | | Surface Conditions After firing | Surface Roughness Rmax (μm) | Die Attach Properties | After Heat Cycle Test | After Thermal Shock Test |
| Sample No. | Silver | Copper | Powder Form | Platinum | Powder Form | Frit | Vehicle | | | | | | |
| --- | --- | --- | --- | --- | --- | --- | --- | --- | --- | --- | --- | --- |
| 14 | 73.87 | 0.38 | Mechanical Alloy | 0.75 | Palladium Single Element Powder (D$_{50}$ = 1.3 μm) | — | 25 | 14 | Good | 7 | Good | A | A |
| 15* | 73.87 | 0.38 | Mechanical Alloy | 0.75 | Palladium Single Element Powder (D$_{50}$ = 5.3 μm) | — | 25 | 15 | Black Stripe Pattern Appeared on Surface | 10 | Fair | A | A |

Note: *Comparative Sample

As clear from Table 3, the paste prepared by singly mixing the palladium powder, the film conditions after sintering were poor and the die attach properties were also poor unless the particle size of palladium was made much smaller. On the contrary, where the composite powder of silver and palladium according to this invention was used, these disadvantages were solved.

Further, when the film obtained by using this paste was left in atmosphere at a temperature of 60° C. and a humidity of 95% for 100 hours, there was observed no migration of Ag.

In addition, by procedures similar to those in Example 2, a bonding test was conducted using an aluminum wire of 30 μm, in diameter, and the change in resistance was measured by exposing to high temperature atmosphere. The measuring conditions were also similar to those in Example 2.

As the result of the measurement, the resistance had been changed from 245 mΩ to 270 mΩ, from which it can be concluded that this is considerably thermally stable as compared with the conventional products.

While the invention has been described in detail and with reference to specific embodiments thereof, it will be apparent to one skilled in the art that various changes and modifications can be made therein without departing from the spirit and scope thereof.

What is claimed is:

1. An electrically conductive paste comprising (i) 60 to 90 wt % of metal fine powders which comprise a silver fine powder having a particle size of 10 μm or less and a composite fine powder of silver and copper having a particle size of 10 μm or less, the copper content in the metal fine powders being 0.1 to 10 wt %, and (ii) 10 to 40 wt % of a vehicle component.

2. An electrically conductive paste according to claim 1, wherein the metal fine powders further contain a composite fine powder of silver and platinum or a platinum fine powder, the platinum content in the metal fine powders being 0.2 to 10 wt %.

3. An electrically conductive paste according to claim 1, wherein the metal fine powders further contain a composite fine powder of silver and palladium or a palladium fine powder, the palladium content in the metal fine powders being 0.2 to 30 wt %.

4. An electrically conductive paste according to claim 1, wherein the copper content in the metal fine powders is 2 to 5 wt %.

5. An electrically conductive paste according to claim 1, wherein the metal fine powder content in the electrically conductive paste is 75 to 82 wt %.

6. An electrically conductive paste according to claim 1, wherein the vehicle component is selected from the group consisting of terpineol, butylcarbitol, ethyl cellulose, butylcarbitol acetate and 2,2,4-trimethylpentanediol-1,3-monoisobutyrate.

7. An electrically conductive paste according to claim 2, wherein the platinum content in the metal fine powders is 0.5 to 3 wt %.

8. An electrically conductive paste according to claim 2, wherein the composite fine powder of silver and platinum has a particle size of 10 μm or less.

9. An electrically conductive paste according to claim 3, wherein the palladium content in the metal fine powders is 0.5 to 10 wt %.

10. An electrically conductive paste according to claim 3, wherein the composite fine powder of silver and palladium has a particle size of 10 μm or less.

11. An electrically conductive paste according to claim 3, wherein the palladium fine powder has a particle size of not more than 5 μm.

12. An electrically conductive paste according to claim 11, wherein the palladium fine powder has an average particle size of 2 μm or less.

13. An electrically conductive paste according to claim 1, wherein said metal fine powders consist essentially of said silver fine powder and said composite fine powder of silver and copper.

* * * * *